US010062963B2

(12) United States Patent
Hunt et al.

(10) Patent No.: US 10,062,963 B2
(45) Date of Patent: Aug. 28, 2018

(54) VERTICAL ELECTRONIC DEVICE WITH SOLID ANTENNA BRACKET

(71) Applicant: THOMSON LICENSING, Issy-les Moulineaux (FR)

(72) Inventors: Mickey Hunt, Camby, IN (US); Julianne Luna So, Fishers, IN (US); William P. Dernier, Indianapolis, IN (US); Randy Wayne Craig, Fishers, IN (US); Darin Bradley Ritter, Indianapolis, IN (US); Kevin M. Williams, Indianapolis, IN (US); Michael Francis Barry, Fishers, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days.

(21) Appl. No.: 15/357,360

(22) Filed: Nov. 21, 2016

(65) Prior Publication Data

US 2017/0149128 A1 May 25, 2017

Related U.S. Application Data

(60) Provisional application No. 62/258,599, filed on Nov. 23, 2015.

(51) Int. Cl.

| | |
|---|---|
| ***H05K 7/00*** | (2006.01) |
| ***H01Q 1/42*** | (2006.01) |
| ***H01Q 1/24*** | (2006.01) |
| ***H01Q 1/38*** | (2006.01) |
| ***H01Q 1/52*** | (2006.01) |

(52) U.S. Cl.
CPC ................. *H01Q 1/42* (2013.01); *H01Q 1/24* (2013.01); *H01Q 1/38* (2013.01); *H01Q 1/521* (2013.01)

(58) Field of Classification Search
CPC .. H01Q 1/42; H01Q 1/24; H01Q 1/38; H01Q 1/521
USPC .......................................... 361/728–730, 752
See application file for complete search history.

(56) References Cited

U.S. PATENT DOCUMENTS

| | | | | |
|---|---|---|---|---|
| 6,222,502 | B1 | 4/2001 | Falbo et al. | |
| 6,803,841 | B2 * | 10/2004 | Saitoh ........................ | H01P 3/16 333/239 |
| 7,692,600 | B1 * | 4/2010 | Pakosz ................. | H01Q 1/2233 343/795 |
| 8,310,403 | B2 * | 11/2012 | Nahar .................. | H01Q 1/2233 340/870.02 |
| 2005/0052328 | A1 * | 3/2005 | De Angelis .............. | H01Q 1/22 343/767 |
| 2012/0086553 | A1 | 4/2012 | Wilkinson et al. | |
| 2017/0025886 | A1 * | 1/2017 | Rohmer ................ | H02J 7/0044 |

FOREIGN PATENT DOCUMENTS

| | | |
|---|---|---|
| EP | 2595240 | 5/2013 |

* cited by examiner

*Primary Examiner* — Hung S Bui
(74) *Attorney, Agent, or Firm* — Jerome G. Schaefer; Richard Laperuta

(57) ABSTRACT

An antenna bracket for electronic devices includes a solid bracket having an aperture formed therethrough. The solid antenna bracket has side walls that are rounded to a predetermined radius, and at least one antenna pocket positioned on said side walls. The antenna pocket receives and secures at least one antenna. The antenna bracket has a polygon shape that follows the contours of the electronic device housing.

15 Claims, 17 Drawing Sheets

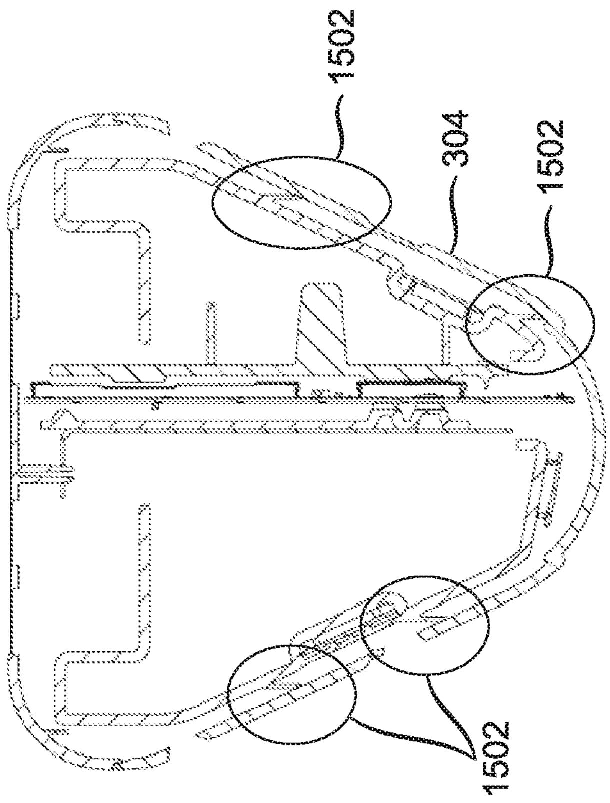
FIG. 16
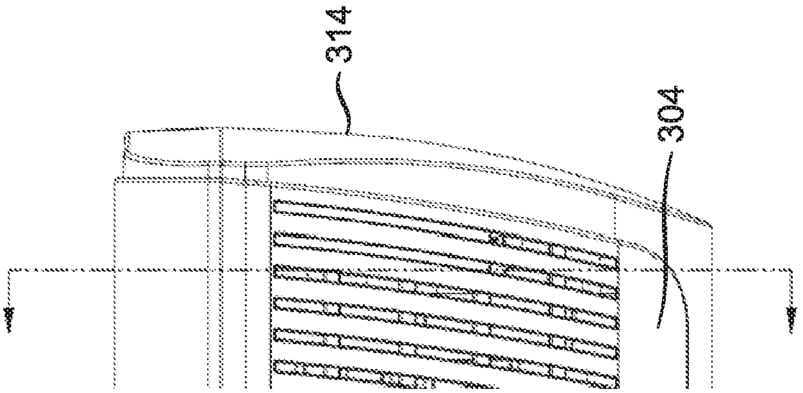

VERTICAL ELECTRONIC DEVICE WITH SOLID ANTENNA BRACKET

CROSS REFERENCE TO RELATED APPLICATIONS

This application claims priority from U.S. Provisional Application Ser. No. 62/258,599 filed on Nov. 23, 2015.

FIELD

The present invention relates to an electronic apparatus and an associated antenna bracket contained therein.

BACKGROUND

The present disclosure can be applicable to most electronic devices that include antennae. Such electronic apparatuses or devices in the field are described as being typically assembled apparatuses having a plurality of walls and a top surface that is generally designed to encase and protect interior components.

Most designs of these electronic apparatuses are such that the top plan view shape is rectangular and the apparatuses are horizontal electronic apparatuses in which the height of the apparatuses is smaller than the horizontal widths of the front wall, rear wall, and the side walls. Such horizontal devices are mechanically stable given their wide bases and their tops being planar horizontal structures.

Given that horizontal devices are mechanically stable with flat tops, their tops can be inviting stable surfaces for people to place objects thereon (such as papers, tools, cups with liquids, and other liquid filled vessels such as vases or potted plants). Although the manufacturers may not encourage the use of the top surfaces for supporting objects, the use of such top surfaces is generally mechanically safe in terms of providing a large flat surface area that will not cause the objects to fall.

New vertical electronic apparatuses are now being contemplated for the consumer market in which the height of the apparatuses is larger than the horizontal widths of at least one of the walls.

The need for a plurality of antennas in these vertically oriented set top boxes or gateway devices particularly presents a challenge. The problem is that in some designs up to seven (7) antennas are required, which means that additional wires must be used to connect the antennas to a circuit board and additional fixtures or antenna supports must be installed in the devices to support the antennas. Further, the antennas not only involve extra handling of the work product in the factory that place other components at risk and drive up manufacturing cost, but these antennas also have a propensity for electrostatic discharge in use. As such, designers must ensure that the antennas are adequately shielded in these devices which tend to be quite crowded. Thus, the need exists for an antenna mounting system that is commensurate with the screw-less attachment concepts and yet do not pose the risk of electrostatic discharge to and from the antennas.

An additional issue in these crowded vertically oriented electronic devices is the implementation of a heat management system. As such, there is a need for such a system that can appropriately spread, dissipate and/or expel heat and yet not interfere with the interior components and the locking mechanism. A further requirement is for the heat management system to not require a substantial increase in the interior volume of the device.

SUMMARY

These and other drawbacks and disadvantages presented by vertically oriented electronic devices are addressed by the present principles, which are directed to a solid antenna bracket contained within a vertical electronic apparatus and associated printed circuits. However, it can be understood by those skilled in the art that the present principles can be taken advantage of in horizontally oriented devices as well.

According to an implementation, the electronic device includes a solid antenna bracket having a top surface, side walls and at least one aperture passing through the top surface. At least one antenna pocket is disposed on one of the side walls of the antenna bracket and receives and secures at least one antenna.

According to another implementation, the electronic device includes a housing having a bottom, side walls and a top defining an interior space, the housing having a polygon shape. A solid antenna bracket is positioned in the interior space of the housing and has a top surface, walls and at least one aperture through passing through the top surface. The solid antenna bracket has the same polygon shape as said housing such that the solid antenna bracket, when positioned in the interior space of the housing, follows the same contours of the housing defined by the polygon shape.

According to another implementation, the electronic device includes a housing having a bottom, side walls and a top defining an interior space. The housing has a polygon shape. A solid antenna bracket is disposed within the housing and has a top surface, side walls and at least one aperture passing through the top surface. The side walls of the solid antenna bracket being rounded to a predetermined radius. A plurality of antenna pockets are disposed on at least one of the side walls of the antenna bracket. Each of the plurality of antenna pockets receives and secures an antenna, while the predetermined wall radius is configured to prevent impedance changes in antennae wires connected to each of the antennas.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which:

FIG. 16 shows a sectional view of an antenna bracket with side impact tabs according to an implementation of the present principles.

DETAILED DESCRIPTION

The present disclosure can also be applicable to electronic apparatuses or devices in the field described as being typically assembled apparatuses having a plurality of walls and an antenna bracket. The present disclosure also addresses how antennas can be supported in an electronic device using an antenna bracket and how the antenna bracket can be constructed to further assist with heat management.

The present description illustrates the present principles. It will thus be appreciated that those skilled in the art will be able to devise various arrangements that, although not explicitly described or shown herein, embody the present principles and are included within its scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Figure 1:
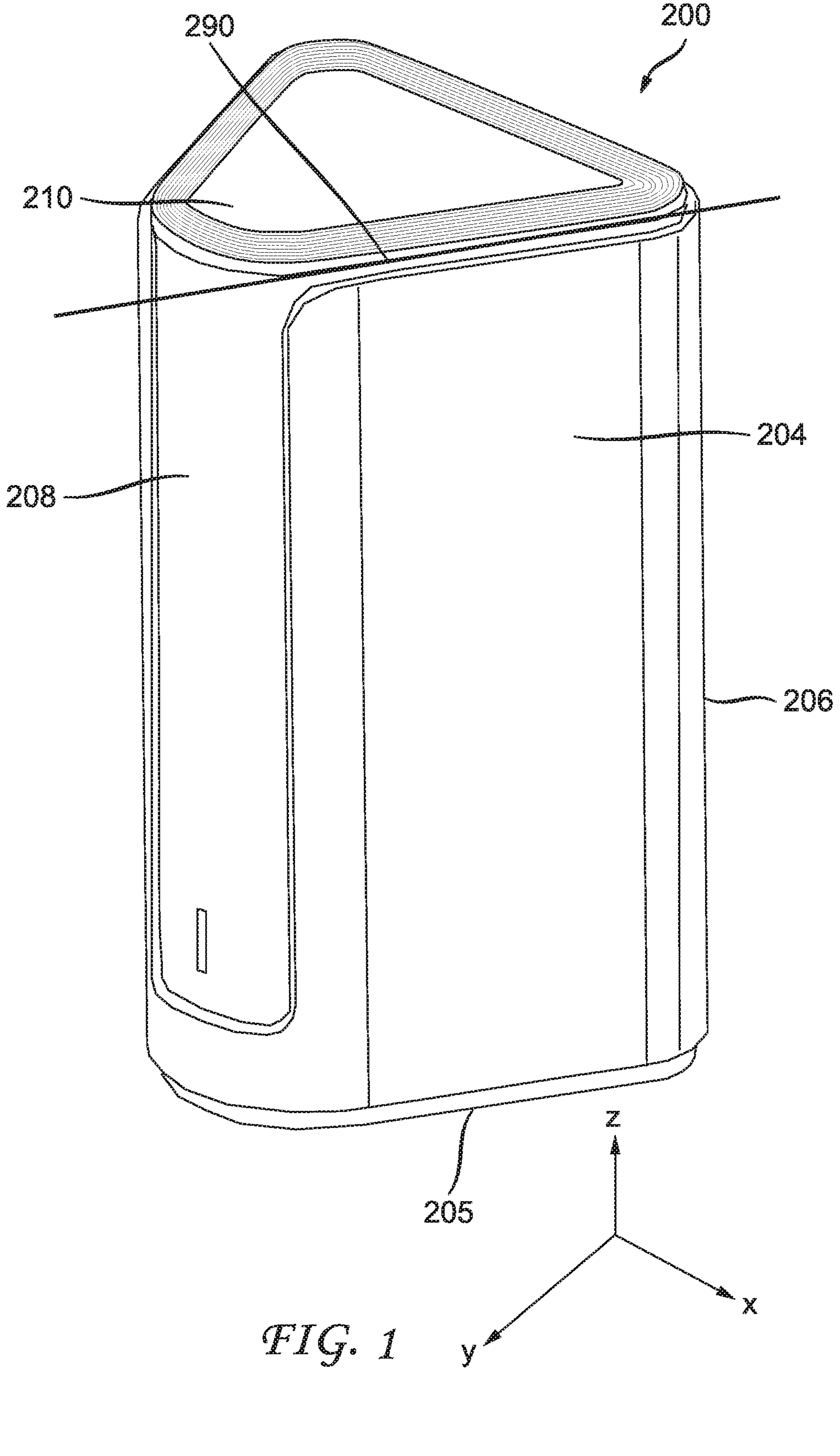
FIG. 1 is a perspective view of a vertically oriented electronic device to which the present principles are applicable.
Figure 2:
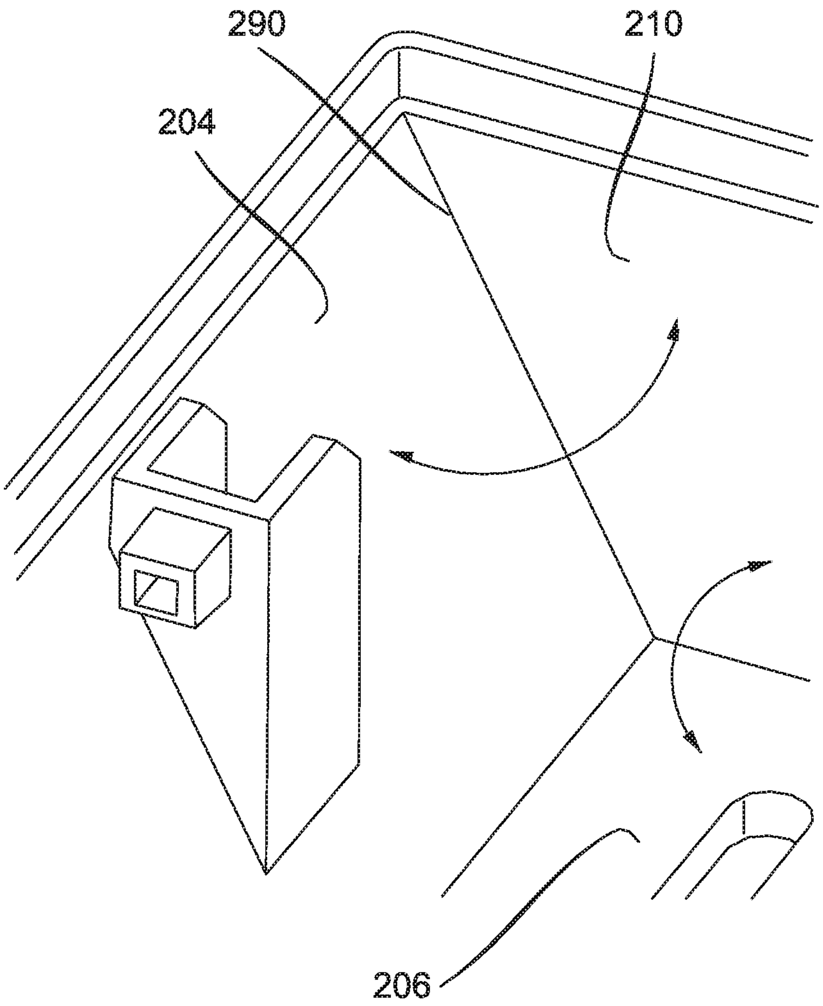
FIG. 2 is an interior view of the vertically oriented electronic device shown in FIG. 1 highlighting various intersections between the top, sides and internal parts, according to an implementation of the present principles.

FIG. 1 shows a perspective view of a considered vertically oriented electronic device 200 having a flat top 210, a front wall or front surface 208, a rear wall 206, side walls 204, and a base 205. FIG. 2 shows an interior view highlighting the intersections of the flat top 210 with the rear wall 206 and the flat top 210 with a side wall 204 in which the intersections 290 are not smooth and continuous. In fact, the intersections 290 can form angles which are 90 degrees.

Unfortunately, the top surfaces or flat tops 210 of such vertical devices can also be inviting for people to place objects thereon. However, for such vertical electronic apparatuses, the placement of the objects thereon is generally not mechanically safe, because (1) such devices have the potential to have high centers of mass and can tip and fall if objects are placed on them, (2) such devices may have access ways that will be covered by objects in a manner that will not only prevent entry, but can cause damage to the entry way and provide an easy entrance way for spilled liquids to enter to the apparatus, and (3) such devices may have heat management systems which may require that the top be free of objects to avoid interfering with heat management systems.

A vertical electronic device is generally disclosed in the embodiments in which the device is not rectangular from a top plan view perspective and has a curved top that provides a number of potential benefits. However, those of skill in the art will appreciate that the electronic device can have other geometries and still incorporate the current principles of the solid antenna bracket of the present disclosure. The curved top can provide some additional interior volume for air circulation to assist in heat management, and can also assist in reducing resistance to interior air flow by providing a smoother and more continuous surface at transition locations (e.g. intersection regions), such as where the interior side wall transitions to the interior top wall. The curved top surface, which is noticeably curved, will discourage people from placing objects thereon, thereby reducing the risk objects being placed on the top surface that can result in damage to top access ways, can interfere with a heat management system, can cause tilting and falling of objects thereon and/or the vertical electronic device, can cause scratches to the top surface, and can cause risk of fluid entry from liquid filled vessels.

The curved top surface can also fit in line with the consumer demand for more unique and attractive consumer devices. In some designs, a curved top may not be necessary and the solid bracket can assist with heat management (when the top is flat and/or not tilted).

Figure 3:
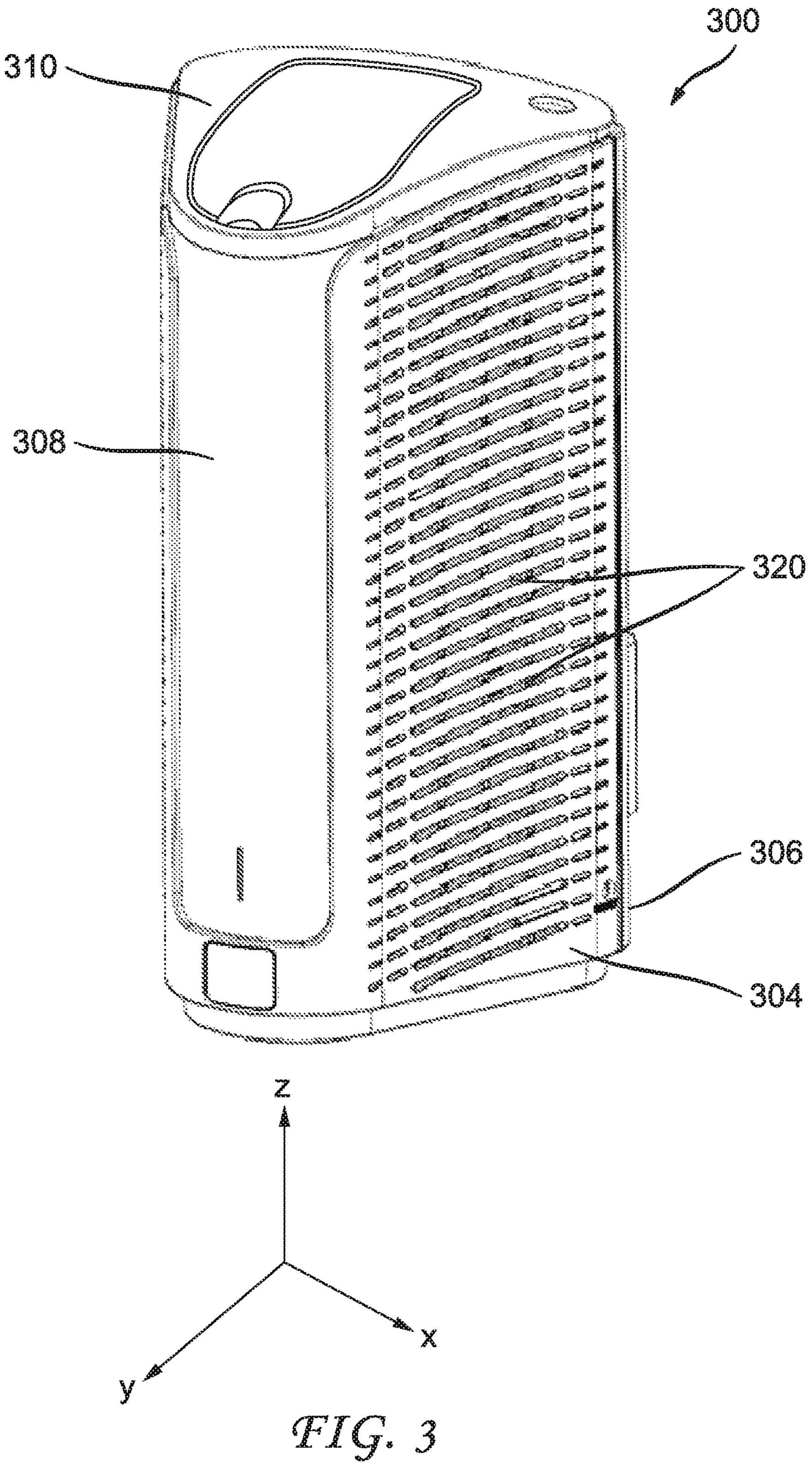
FIG. 3 is a perspective view of another vertically oriented electronic device to which the present principles are applicable.

FIG. 3 shows a perspective view of a vertically oriented electronic device 300 applicable to the current principles which includes the solid antenna bracket. The device 300 has a housing that comprises a curved top 310, a front wall or front surface 308, a rear wall 306, side walls 304, and a base 305. The solid bracket can be incorporated in this device 300 to further enhance heat management.

Figure 4A:
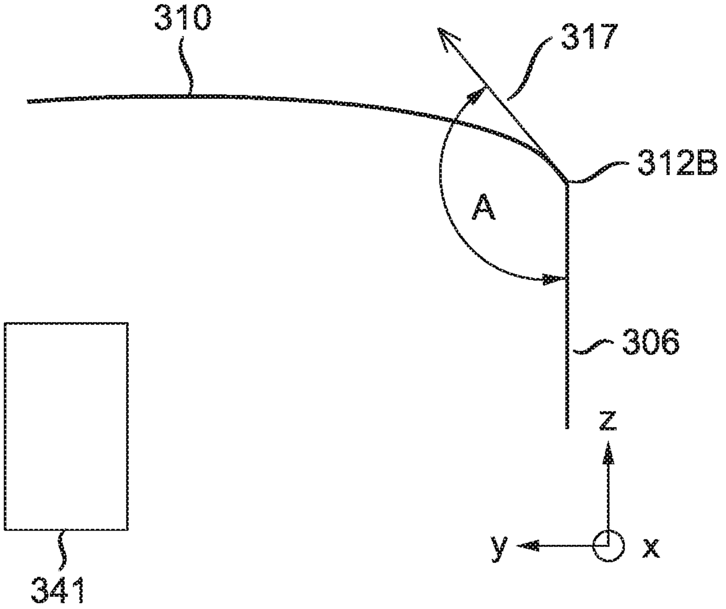
FIG. 4A is an interior view of the vertically oriented electronic device of FIG. 3 highlighting an intersection between the top and back panel according to an implementation of the present principles.

FIG. 4A shows an interior section view highlighting the intersection 312A of the curved top 310 with the rear wall 306. This view shows that the intersection may blend the two surfaces such that the intersection is more smooth and continuous than that of the intersections 290 in device 200, and that an angle A between the rear wall and a tangent 317 of the interior surface of the top 310 can be greater than 90 degrees. The intersection 312 may also form a blended radius.

Figure 4B:
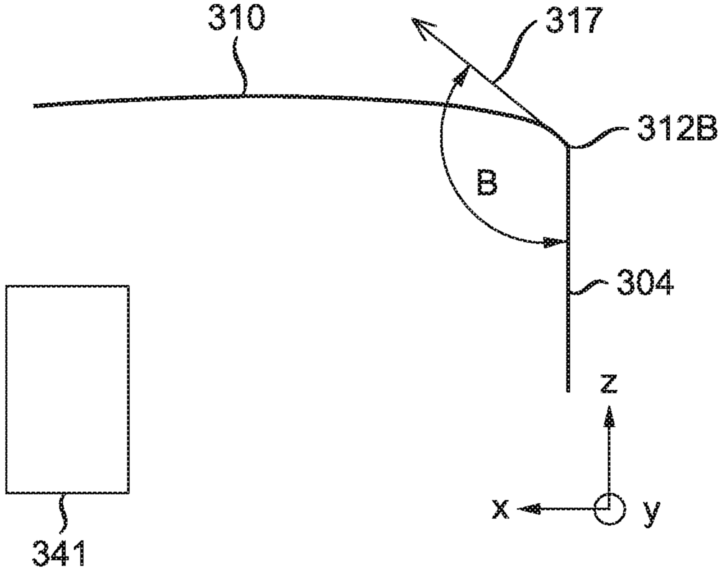
FIG. 4B is an interior view of the vertically oriented electronic device of FIG. 3 highlighting an intersection between the top and side panel according to an implementation of the present principles.

FIG. 4B shows an interior section view highlighting the intersection 312B of the curved top 310 with the side wall 304. This view also shows that the intersection may blend the two surfaces such that the intersection is more smooth and continuous than that of the intersections in device 200, and that an angle B between the rear wall and a tangent 317 of the interior surface of the top 310 can be greater than 90 degrees. The intersection 312B may also form a blended radius. It should be noted that the intersection geometry can vary around the periphery of the top 310.

It should be understood that the device is an electronic device that contains at least one electronic component 341 generically shown in FIG. 4 which can include a printed a circuit board (PCB), a hard drive, a smart card assembly, a tuner, and an antenna, etc.

Also, it is intended that expressions such as "back" and "front" and "vertical" and "horizontal," as well as other complementary terms are intended to be construed from the perspective of the observer of the figures; and as such, these expressions can be interchanged depending upon the direction from which the device is observed.

Figure 5:
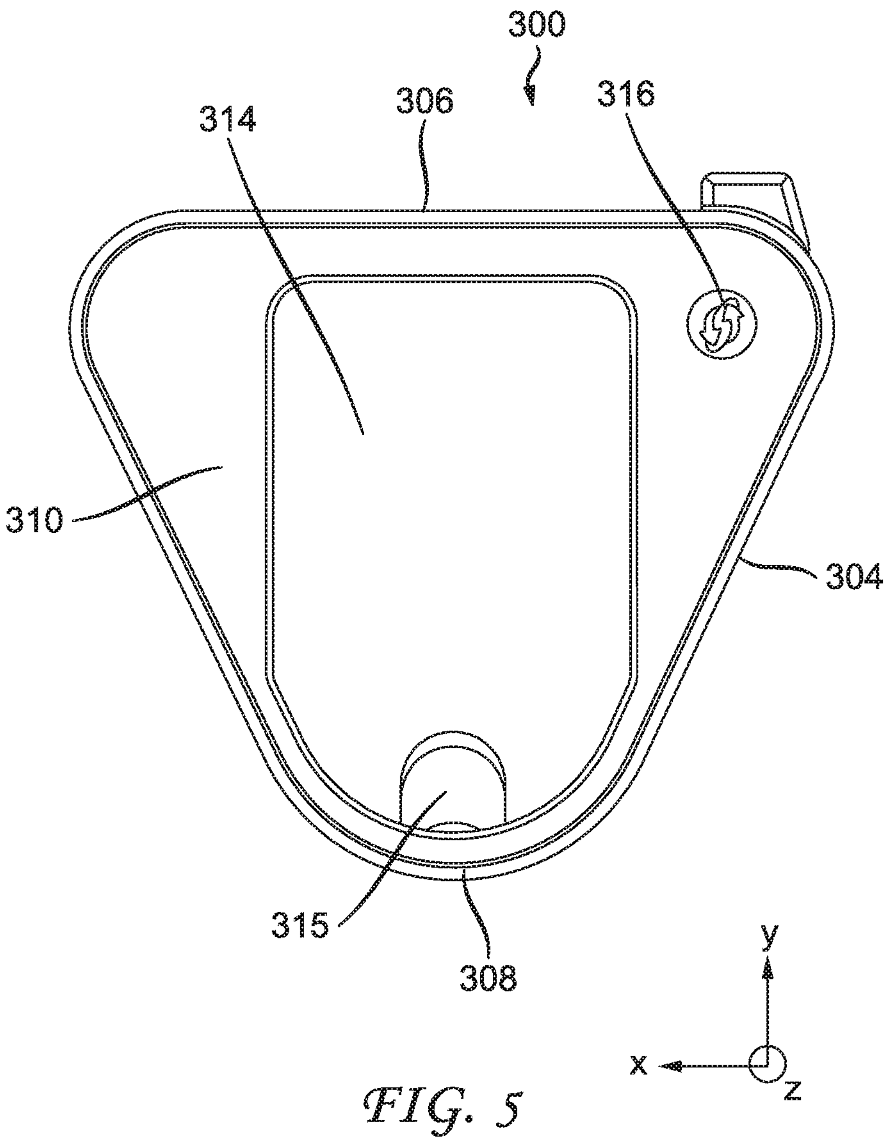
FIG. 5 is a top view of a vertically oriented electronic device to which the present principles are applicable.

FIG. 5 is a top plan view of the vertically oriented electronic device 300 in which an access door 314 and a power button 316 are shown. This view shows that the access door can have a thumb access slot 315 positioned toward the vertical front surface 308. The hinge for the door 314 can be positioned near vertical rear wall 306. The access door 314 can provide entry for such components as a hard drive/hard drive bay, a smart card/smart card bay, and/or a reset button. These types of components can be accessed through the aperture in the solid antenna bracket. In other words, the aperture can be adapted to be commensurate with the feature to be accessed by the door if a door is desired. (Some designers may not want a top door.)

Figure 6:
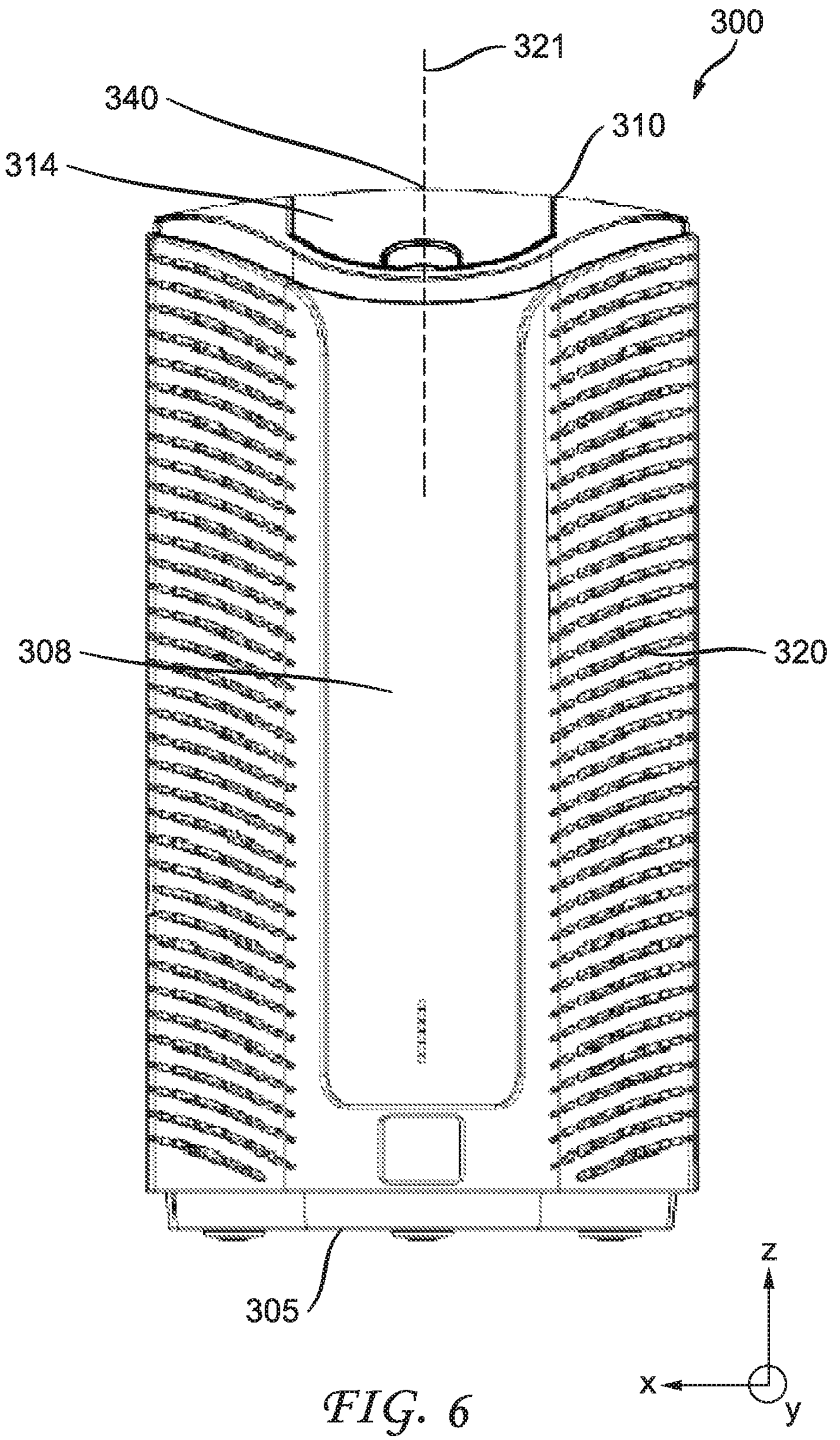
FIG. 6 is a front view of a vertically oriented electronic device to which the present principles are applicable.

FIG. 6 is a front plan view of the vertically oriented electronic device 300 that has the solid antenna bracket (not shown) and which shows a series of vents 320 on the side walls 304 which can be part of the heat management system of the device. The vents 320 can be positioned over a majority of the plan view surface area of the side walls, and can work with the air circulation character that the curved interior geometry of the curved top which reduces air resistance to permit air to flow more freely past, to and through the vents 320.

This view in FIG. 6 shows that the curvature of the top 310 along the major horizontal x-axis can have an ultimate peak 340 somewhere along the center line 321 of the major axis of the device 300, and that top surface along the center line 321 of the major axis can form a series of peaks with respect to horizontal slices parallel to the x-z plane.

Figure 7:
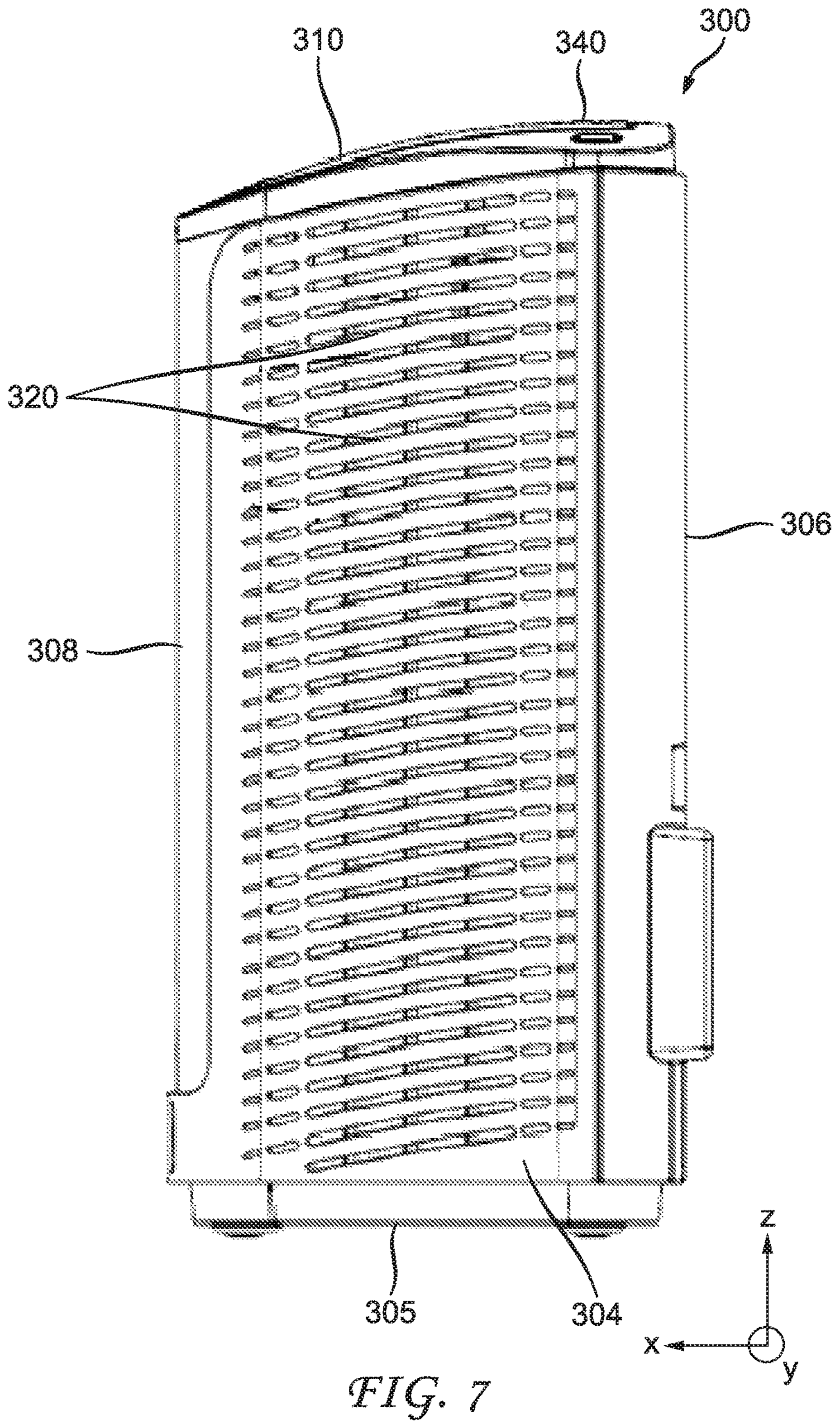
FIG. 7 is a side view of a vertically oriented electronic device to which the present principles are applicable.

FIG. 7 is a side plan view of the vertically oriented electronic device 300 according to the current principles having the solid bracket. This view shows that the curvature of the top 310 along the minor horizontal y-axis can have an ultimate peak 340 along the center line 321 of the major axis of the device 300 and that the ultimate peak 340 is positioned closer to the rear wall 306 than the front surface 308. This ultimate peak 340 in FIG. 7 can be the same ultimate peak shown in FIG. 6.

In sum, the disclosure can include a vertically oriented set top box or electronic device that can have vertical side walls 304 that extend from a vertical rear wall 306. The vertical side walls can narrow as they extend toward a narrow front surface 308. The device further can include a curved top 310 that extends from the vertical side walls 304, the vertical rear wall 306 and the front surface 308. The exterior surface of the top 310 can be convex and have a spherical shape, wherein the exterior top surface can be preferably angled such that all of the exterior top surface to a majority area of the exterior top surface, for example 75%, is tilted or angled downward toward the front surface 308. The exterior top surface of the top 310 can also be convex and have a circular shape along vertical planes parallel to the major axis and/or along vertical planes parallel to the minor axis, wherein the exterior top surface can be preferably angled such that all of the exterior top surface to a majority area of the exterior top surface, for example 75%, is tilted or angled downward toward the front surface 308. The exterior top surface of the top 310 can also be convex and curved along vertical planes parallel to the major axis and/or along vertical planes parallel to the minor axis, wherein the exterior top surface can be angled such that all of the exterior top surface to a majority area of the exterior top surface, for example 75%, is tilted or angled downward toward the front surface 308.

Embodiments of the disclosure can include various combinations of the features thus far described and can further include the features shown in FIGS. 4 A and 4B, wherein the interior intersections 312A and B of the curved top 310 with the rear wall 306 and side wall 304 can blend the two surfaces such that the intersection 312A and B are more smooth and continuous than intersections 290 in device 200 which form right angles. The intersections 312A and 312B can have angles A and B, respectively between the rear wall and a tangent 317 of the interior surface of the top 310 that is greater than 90 degrees. The intersection 312A or B may also form a blended radius. It should be noted that this feature of the intersections 312A or B, being more smooth and continuous, can be applied to the side wall and top surface intersection and the front surface and top surface intersections. The intersections 312A and B geometry may vary along the perimeter of the top 310. In other words, it can apply to all or any of the surfaces that connect to the top interior surface.

Figure 8:
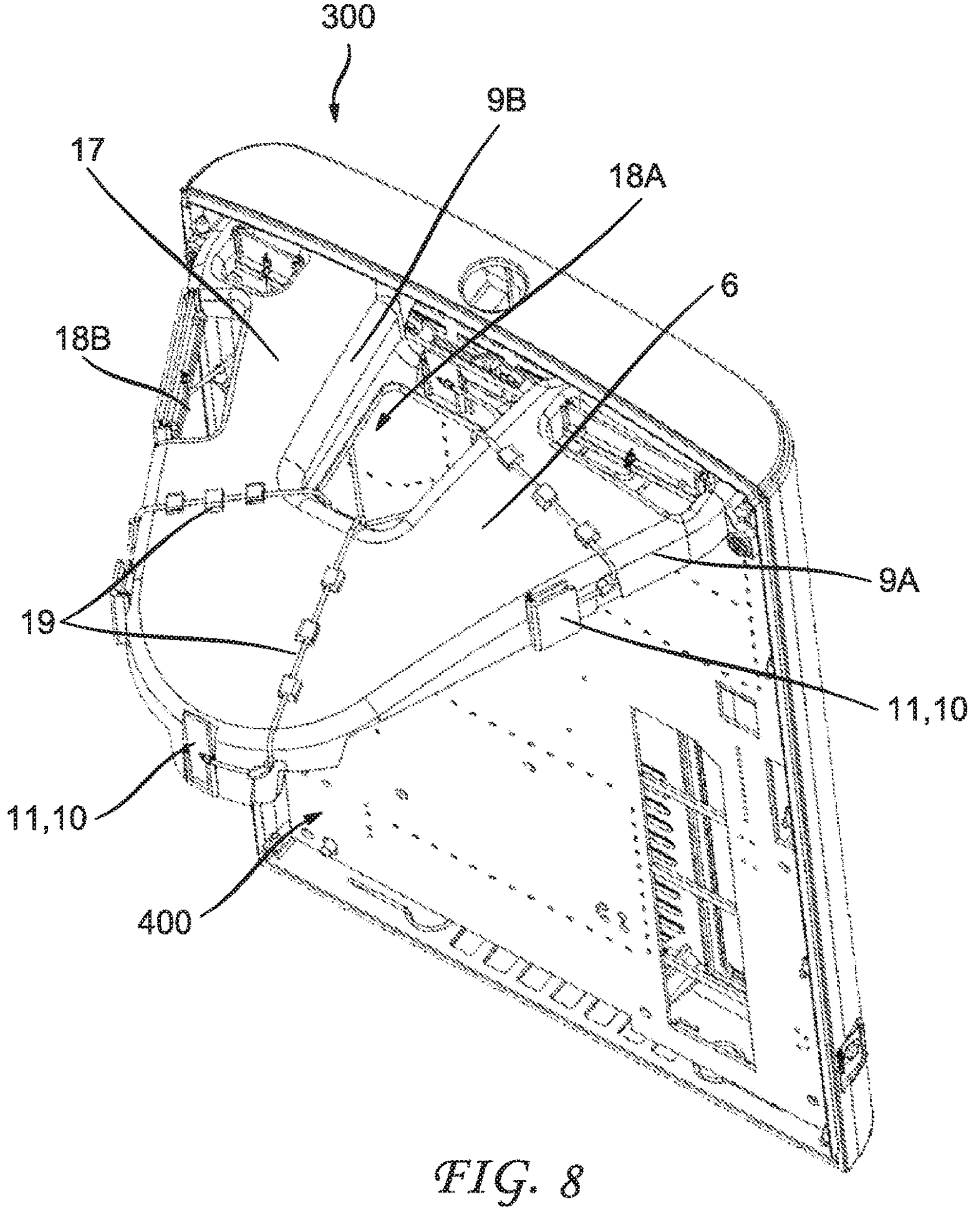
FIG. 8 is a perspective view of the antenna bracket inside a vertically oriented electronic device, according to an implementation of the present principles.
Figure 9:
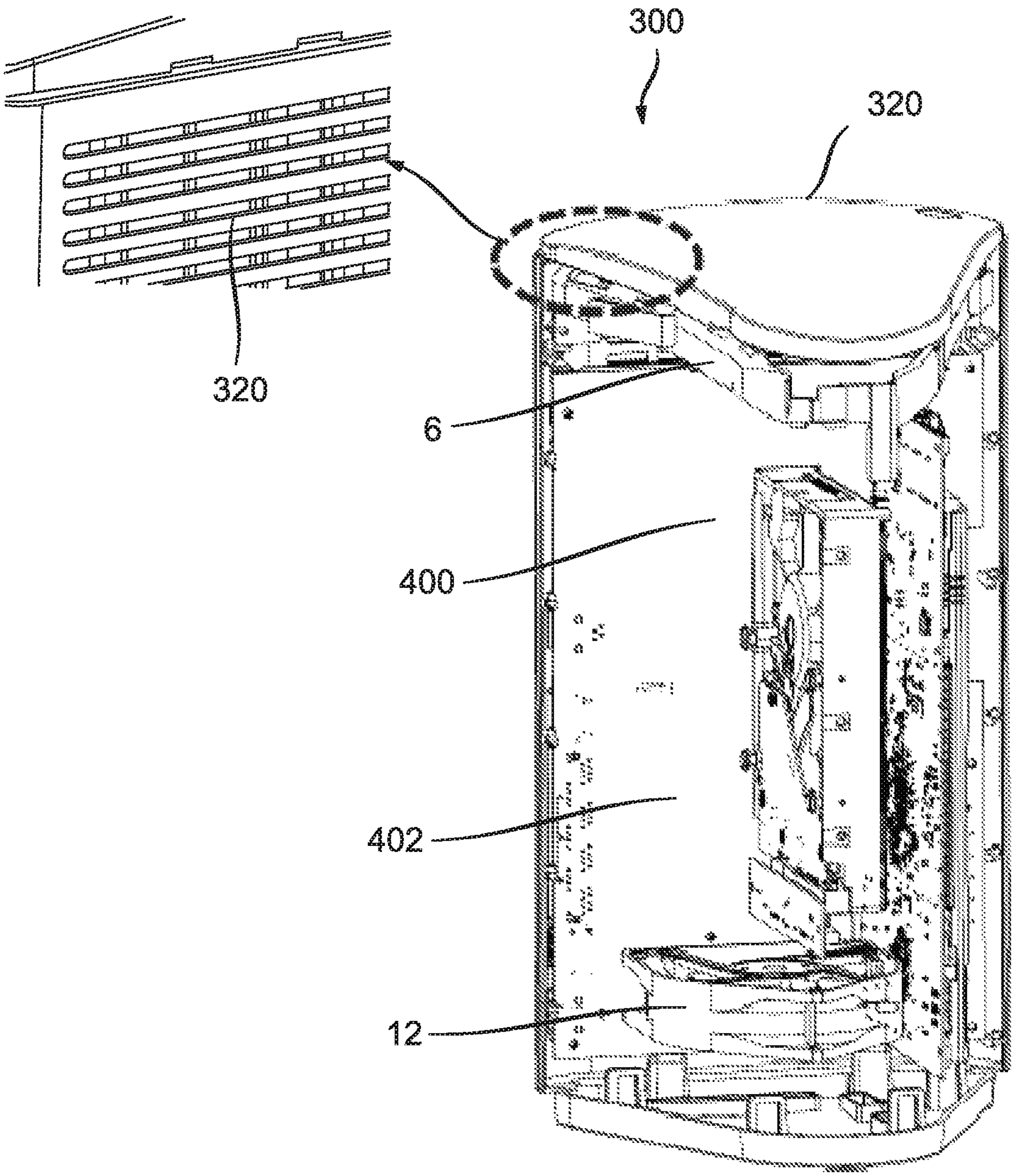
FIG. 9 is a perspective view of a vertically oriented electronic device having the antenna bracket installed therein, according to an implementation of the present principles.

Referring to FIG. 8 and FIG. 9, there is shown a portion of the electronic device 300 (such as a set top box) having a solid antenna bracket 6 in accordance with an implementation of the present principles. An internal back wall of the device 300 generally includes one or more circuit boards 400. The solid antenna bracket 6 is connected to the back wall of the device 300 in any suitable known manner, and can even be manufactured as one piece with the back wall. The antennal bracket 6 includes multiple bracket walls 9A and 9B to form a polygon structure having a solid top surface 17 having an apertures 18A and 18B, and antenna pockets 10 supported on at least two outside bracket walls 9*a*. The inside walls of the aperture 18A are also referred to as walls 9*b* herein. The outside bracket walls 9*a* and inside bracket walls 9*b* have a predetermined curvature or radius of curvature that prevents impedance changes in the antenna wire 19 connected to the respective antennae 11. Those of skill in the art will appreciate that the particular curvature or radius of curvature for the walls 9*a* and 9*b* will depend on the thickness of the antenna wires 19. As such, the radius of such curvature can be for both walls 9*a* and 9*b*, for example, 6 mm or larger to prevent any impedance degradation and thereby prevent any negative impact on the overall antenna performance.

The antennae 11 fit within and are secured in place by the antenna pockets 10 and these pockets operate to prevent electrostatic discharge to and/or from the antennae 11 and antennae wires 19 as they pass through the aperture 18A. In accordance with one implementation, the polygon structure of the bracket 6 can have rounded corners. The antennae 11 can be part of a laminated antenna printed circuit board arrangement. In accordance with other implementations, the polygon structure of the antenna bracket 6 can follow the shape and contours of exterior walls of the electronic device. The solid top surface 17 of the bracket 6 has a top plan view surface area substantially larger than a surface area defined by the open area of the aperture 18A or aperture 18B contained therein. In accordance with other implementations, additional apertures 18B may also be included in the antenna bracket 6 (See e.g., FIG. 13).

Referring to FIG. 9 and as mentioned above, the electronic device can include a heat management vents 320 positioned on any of the exterior walls which can be positioned adjacent the antennae 11 and antenna bracket 6. A fan 12 can be internally positioned at the base of the device 300 as part of the heat management system of the device. The back wall 400 of the device 300 generally includes a printed circuit board. It will be apparent from this figure that the housing of electronic device 300, with the components mounted therein define an interior space 402 within the device 300 when the walls are assembled and the device is enclosed. This interior space 402 is part of the consideration when air flow within the device for cooling purposes is considered.

Additional embodiments can include the features described herein, but the exterior surface of the top 310 including the access door 314 being characterized as part of the exterior top surface. The door 314 can register with the aperture 18 of the bracket 6 such that features such as buttons or slots or the like can be access through the bracket 6 when the door is opened.

Figure 10A:
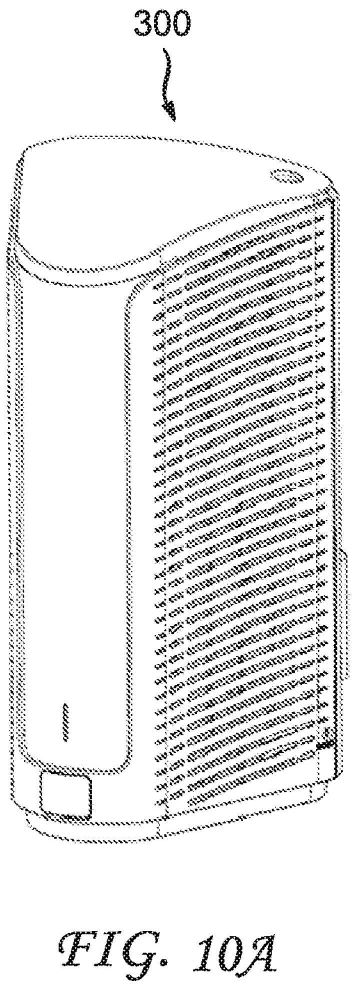
FIG. 10A is a perspective view of a vertically oriented electronic device with the casing, to which the present principles are applicable.
Figure 10B:
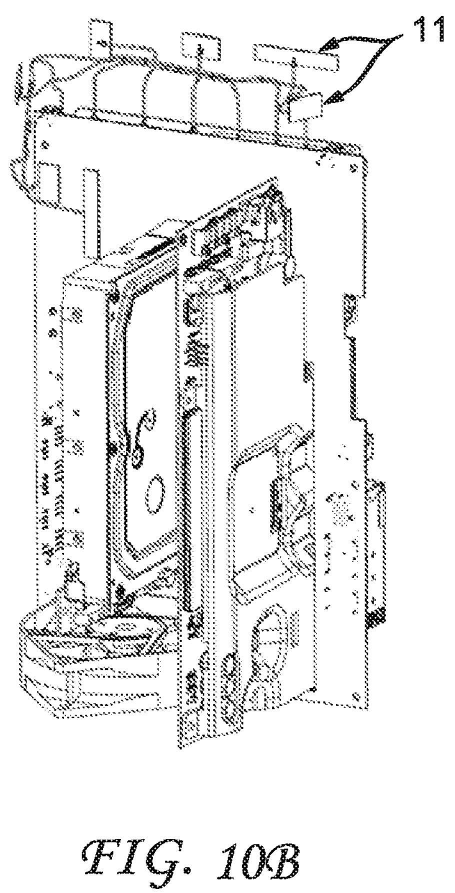
FIG. 10B is a perspective view of a vertically oriented electronic device without the casing, to which the present principles are applicable.

FIG. 10A and FIG. 10B show the electronic device 300 with the housing (FIG. 10A) and without the housing (FIG. 10B). Without the housing, FIG. 10B shows an example of where the antennae 11 are positioned within the electronic device/set top box 300. The bracket 6 and the pockets 10 (not shown) thereof are configured to support the antennae 11 such that they are maintained in the proper orientation as intended.

Figure 11:
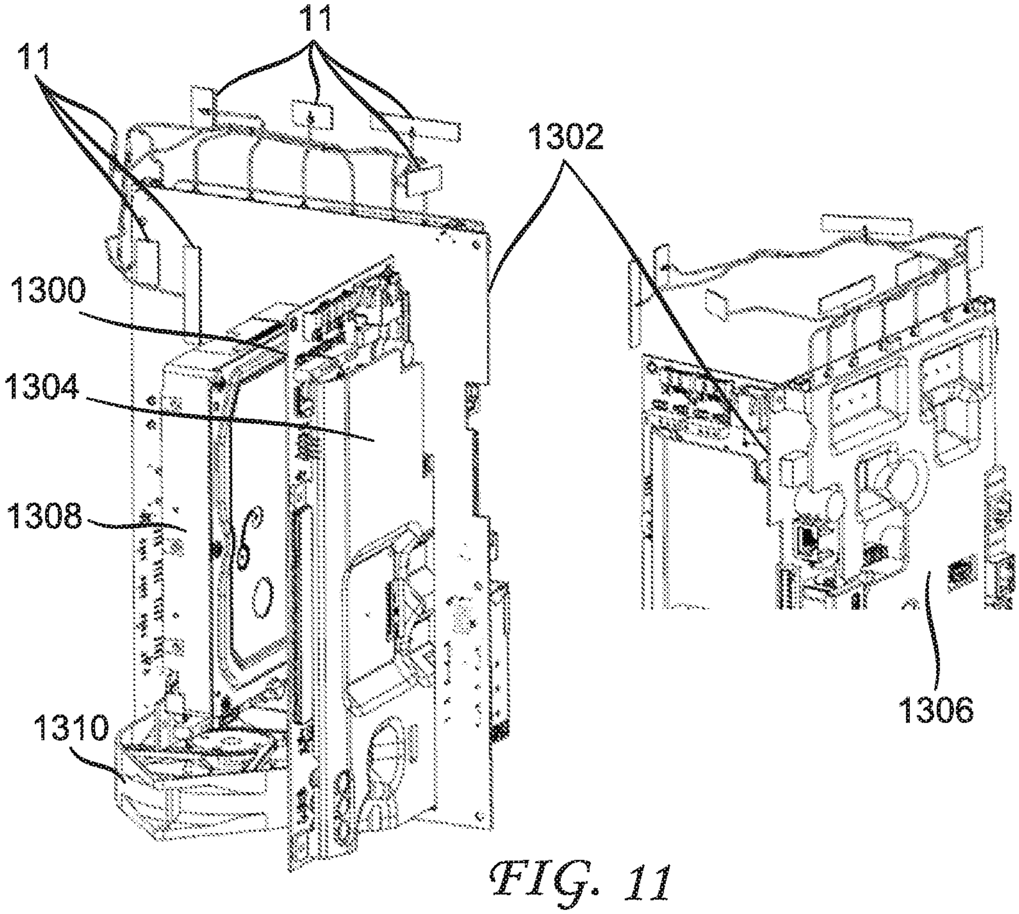
FIG. 11 is an internal view of the circuitry of a vertically oriented electronic device to which the present principles are applicable.

FIG. 11 shows additional views of the electronic device and internal layout of the same. Here, the views show that the device can have two vertically oriented main components, such as a set top box printed circuit board (PCB) assembly 1300 and a gateway PCB assembly 1302 which can be perpendicular to one another and each can have a heatsink or heat spreader 1304 and 1306, respectively. The antennae 11 are also shown connected to their respective PCBs. The other components can be, for example, hard drives 1308 and/or circuit boards, and/or fans 1310. The circuit board 1302 can be positioned parallel to the rear wall of the device and can have the heatsink or heat spreader 1306 positioned between the rear wall and the circuit board.

Figure 12A:
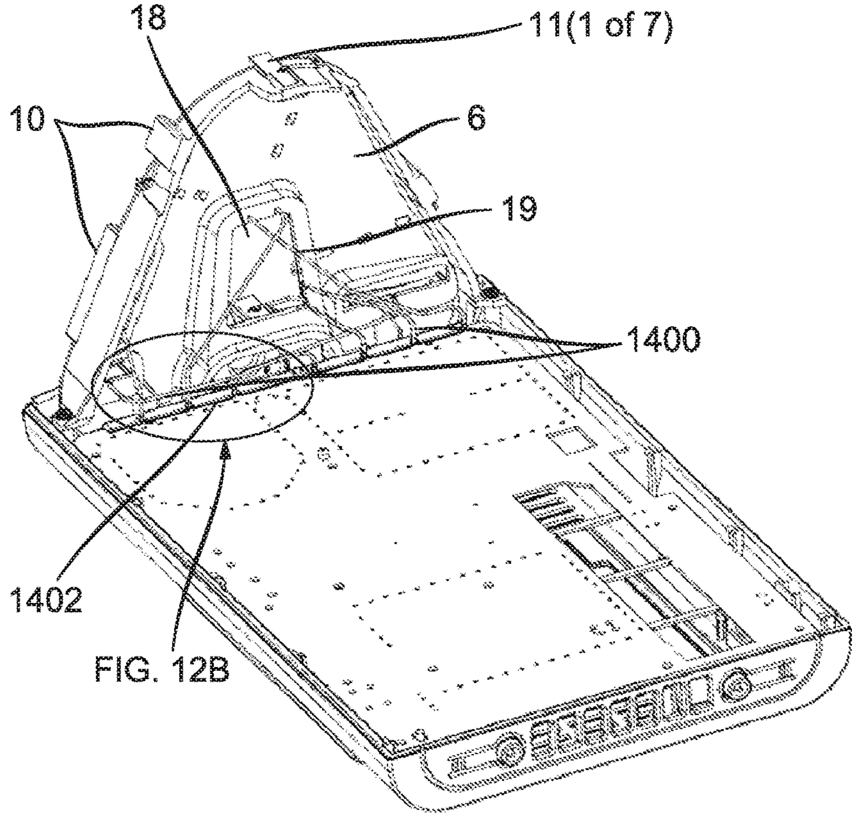
FIG. 12A shows an additional interior view of the electronic device with the antenna bracket, according to an implementation of the present principles.
Figure 12B:
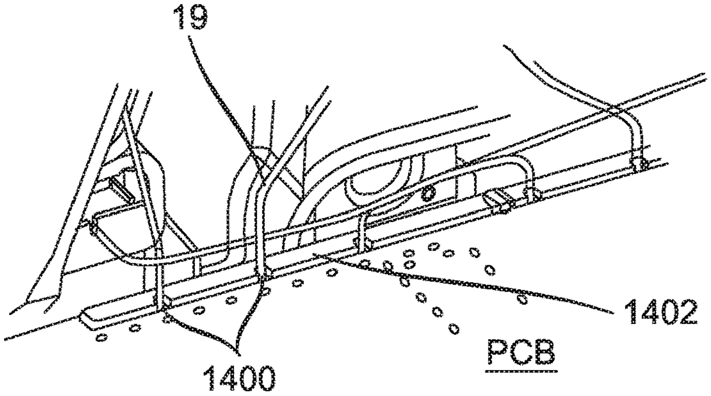
FIG. 12B shows a retention cover on the printed circuit board according to an implementation of the present principles.
Figure 14:
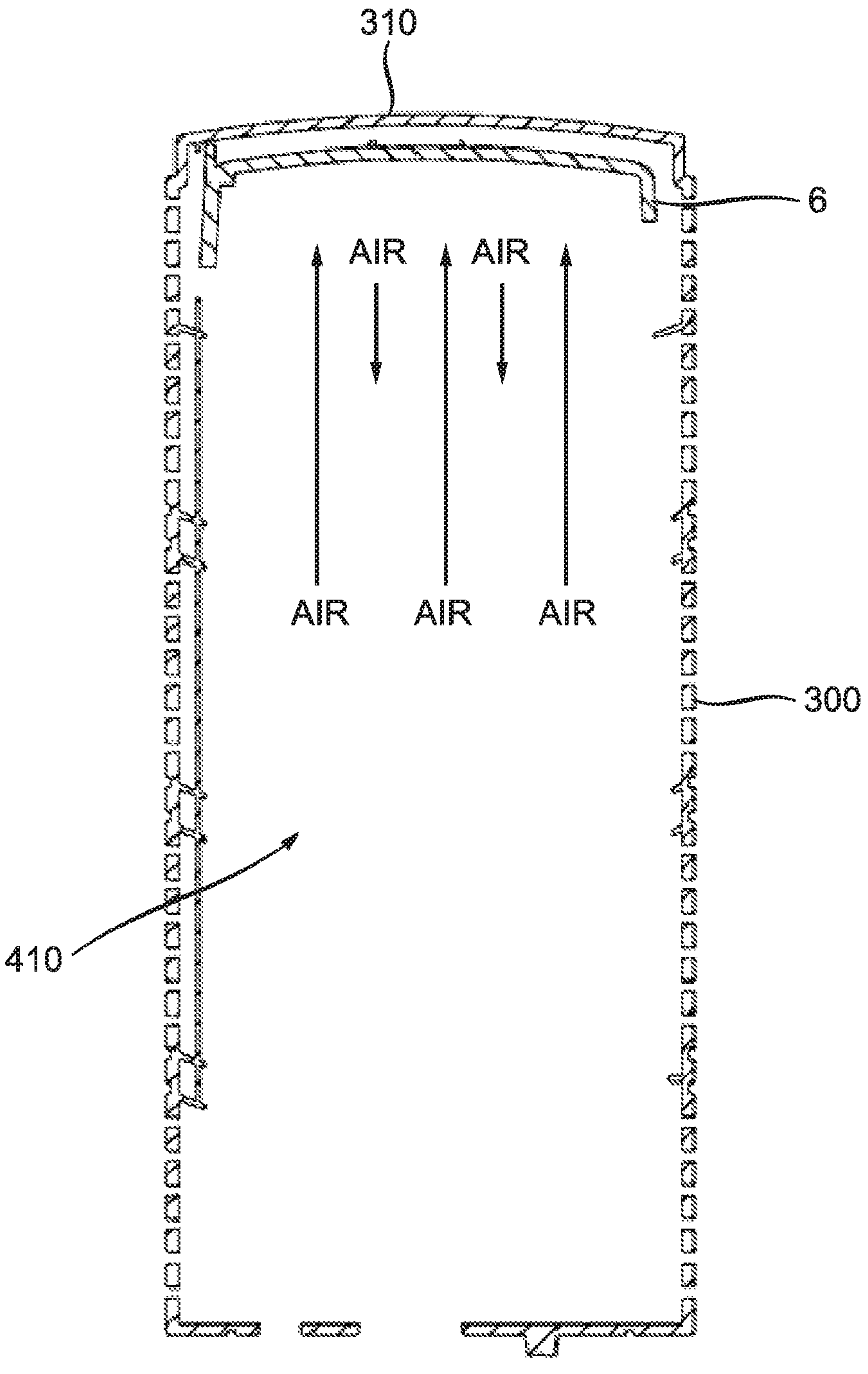
FIG. 14 shows an interior cross section view of a vertically oriented electronic device and the air flow of within the same, according to an implementation of the present principles.

FIG. 12A and FIG. 12B show additional interior views of the electronic device with the antenna bracket 6 according to an implementation of the present principles. Here, the views show how the bracket 6 can assist with the prevention of electrostatic discharge (ESD), because the brackets contact the antenna pockets 10. FIG. 14 shows how ribs 1400 can be applied to edge of a retention cover 1402 affixed onto the edge of the printed circuit board to retain the antenna wires 19 down to assist with installation and permanent mounting of the antennae.

Figure 13:
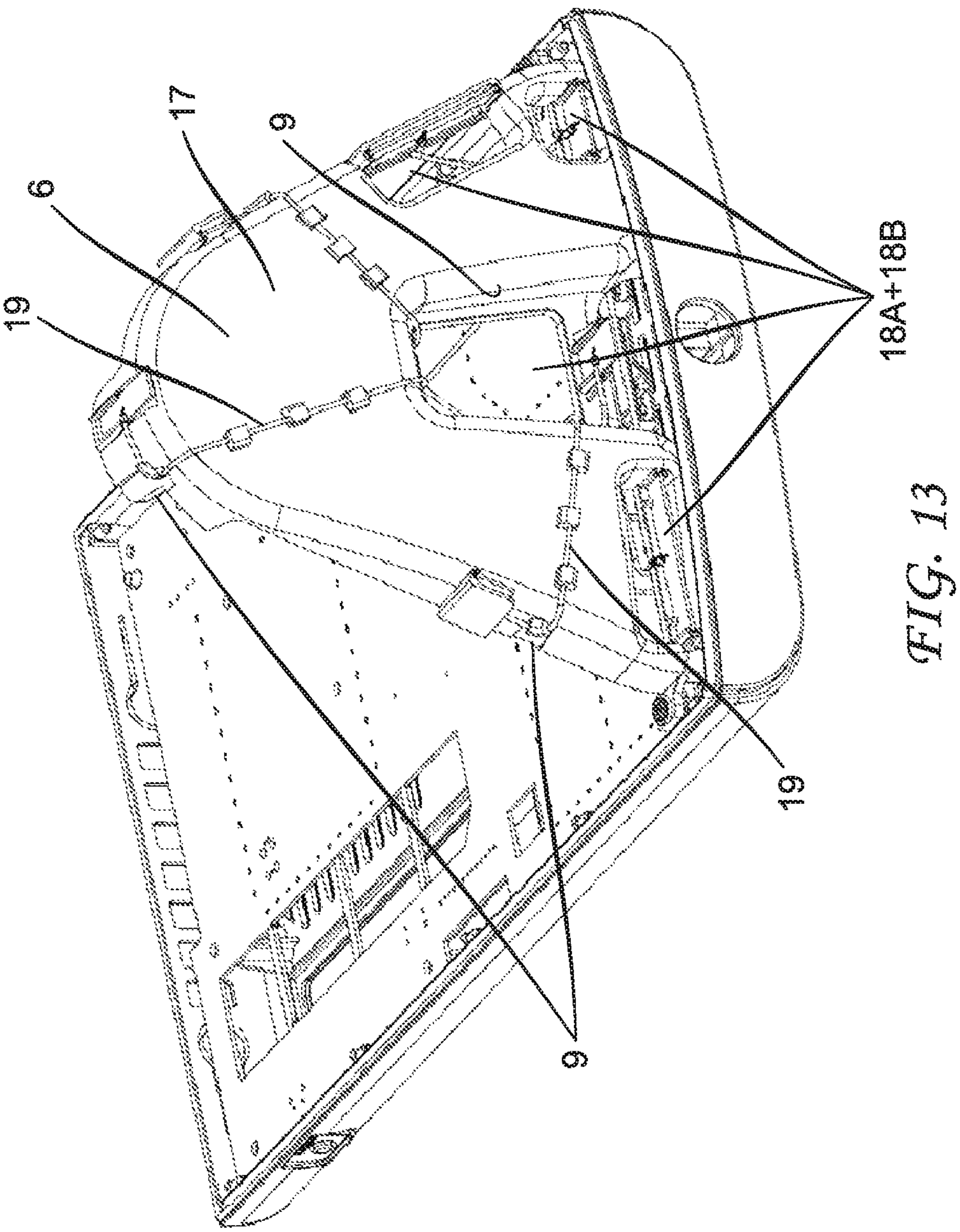
FIG. 13 is another perspective view of the antenna bracket and the front panel of the vertically oriented device, according to an implementation of the present principles.

FIG. 13 shows how the antennae wires 19 can be routed. In some circumstances, it is important that wires 19 must not be bent any sharper than a predetermined radius to ensure that the wires are neither damaged nor that the impedance of the wires changes. This minimum radius will be responsive to the diameter of the wire and electrical requirements of the wire. To accommodate this aspect, the apertures 18A and 18B are included in the bracket 6, and the rounded edges 9*a* of the bracket (and the internal edges 9*b* of the apertures 18A and B) are configured to provide a specific inside bend radius to the antennae wires 19 so as to minimize or eliminate completely a degradation of performance of the antennae. As mentioned above, this bend radius is preferably 6 mm or larger so that no impedance changes in the antenna wire occur when mounting the same on the antenna bracket 6.

FIG. 14 shows an interior cross section view of the device and how the solid antenna bracket 6 can prevent the top of the set top box from getting over heated by redirecting upwardly directed hot air downward and away from the top. This view shows the top surface of the bracket 6 follows the contour of the top of the set top box and yet is spaced away from the same to allow for air flow thorough the interior space 402, and thus internal heat management of the electronic device.

Figure 15:
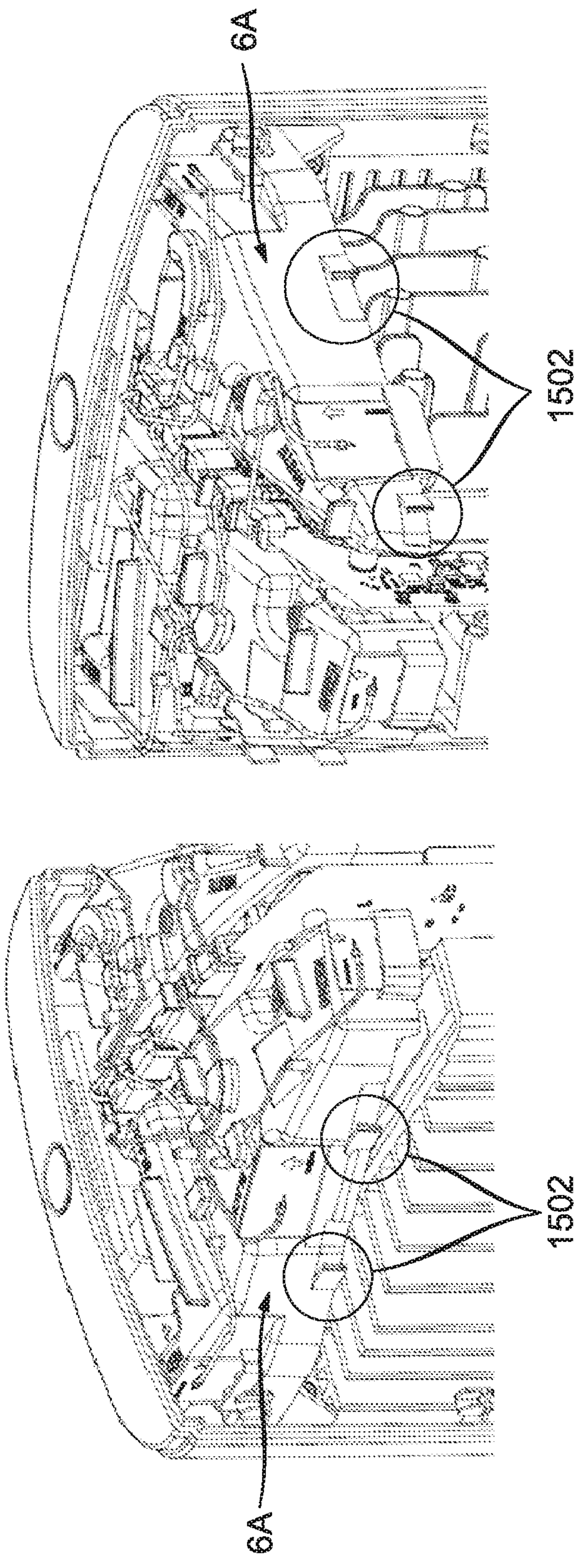
FIG. 15 shows a perspective view of an antenna bracket with side impact tabs according to an implementation of the present principles.

When a vertical or stand-up set-top box is accidentally knocked over onto a hard surface, it may be exposed to shock forces upon impact which may be destructive to internal electronic and mechanical components. In one embodiment, FIG. 15 illustrates the addition of a side impact cushion feature to an antenna bracket 6A. Here, tabs of material 1502, such as plastic, rubber, composite, or other suitably flexible material, may be added or molded into the antenna bracket 6A. The addition of these flexible tabs 1502 for side impact protection supplies a cushioning feature placed between the antenna bracket 6A on which the tabs 1502 are affixed or molded and an inside surface of the side wall 304. Antenna bracket 6A is a variation of antenna bracket 6. The addition of flexible tabs 1502 for side impact protection may be added to any antenna bracket, including antenna bracket 6.

Figure 17A:
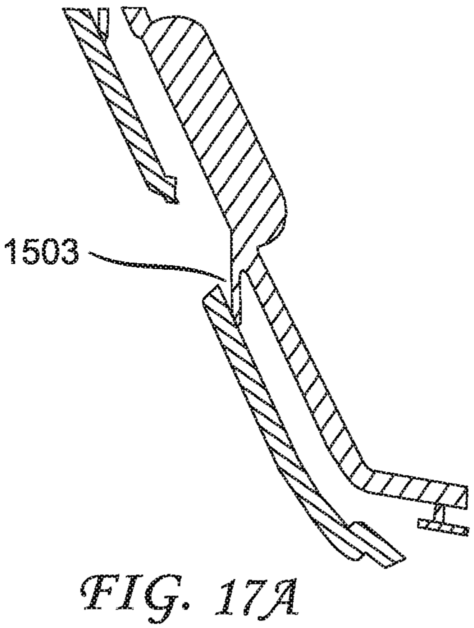
FIG. 17A shows an deflection tab in a normal position according to an implementation of the present principles.
Figure 17B:
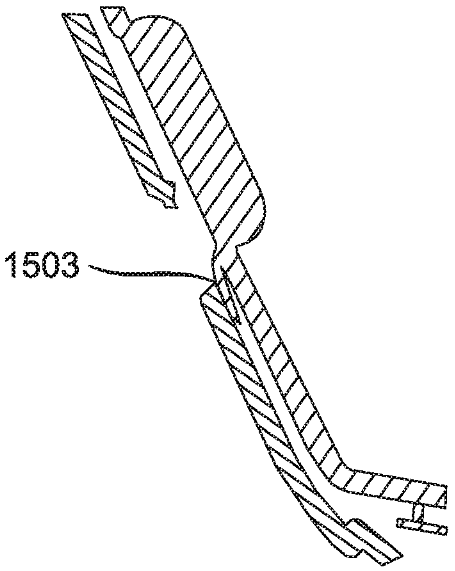
FIG. 17B shows the tab in a deflected position according to an implementation of the present principles.

In one embodiment, FIG. 16 shows the general location of side impact tabs 1502 in a cross-sectional view of the set-top box. In function, the side impact tabs 1502 are flexible to absorb the energy of an impact by deflecting when stress is imparted in the situation of a set-top box being tipped over onto its side. FIG. 17(A) depicts an example tab 1503 in its normal position. This position represents the position that a side impact tab would exhibit when the set-top box in standing in a normal vertical position. FIG. 17(B) illustrates the deflection action that example tab 1503 would exhibit while incurring a side impact event, such as occurs when a set-top box is tipped on its side. Note that FIG. 17B is indicative of the tab as it absorbs the impact stress. After deflection of the tab 1503, the flexible tab 1503 returns to its normal position shown in FIG. 17(A).

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope of the present principles. All such changes and modifications are intended to be included within the scope of the present principles as set forth in the appended claims.

What is claimed is:

1. An electronic device comprising:

a housing having exterior walls forming a polygon shape;

a solid antenna bracket, located underneath the exterior wall of the housing, having a top surface, walls and at least one aperture passing through the top surface;

at least one antenna pocket disposed on a wall of the antenna bracket, the at least one antenna pocket receiving and securing at least one antenna;

wherein antenna wires are routed through the at least one aperture.

2. The electronic device according to claim 1, wherein the walls of said solid antenna bracket are rounded to a radius, said radius preventing impedance changes in an antenna wire connected to the at least one antenna.

3. The electronic device according to claim 2, wherein said at least one aperture comprises internal walls, and said internal walls have a radius as said rounded walls.

4. The electronic device according to claim 3, further comprising at least one additional antenna pocket positioned on the internal wall of the at least one aperture.

5. The electronic device according to claim 1, wherein the solid antenna bracket has flexible tabs for side impact protection.

6. The electronic device according to claim 1, wherein a polygon shape of the antenna bracket follows a shape and a contour of exterior walls of the electronic device.

7. The electronic device according to claim 1, wherein said top surface comprises a surface area that is larger than a surface area defined by the open area of said at least one aperture.

8. An electronic device comprising:

a housing having a bottom, side walls and a top defining an interior space, the housing having a polygon shape;

a solid antenna bracket having a top surface, walls and at least one aperture passing through the top surface, said solid antenna bracket having the same polygon shape as said housing such that the solid antenna bracket, when positioned in the interior space of the housing, follows same contours of the housing defined by the polygon shape, and wherein antenna wires are routed through the at least one aperture.

9. The electronic device according to claim 8, wherein the solid antenna bracket further comprises at least one antenna pocket disposed on a wall of the antenna bracket, the at least one antenna pocket receiving and securing at least one antenna.

10. The electronic device according to claim 8, wherein the walls of said solid antenna bracket are rounded to a radius, said radius preventing impedance changes in an antenna wire connected to the at least one antenna.

11. The electronic device according to claim 8, wherein said at least one aperture comprises internal walls, and said internal walls have a radius as said bracket rounded walls.

12. The electronic device according to claim 8, wherein said top surface of said antenna bracket comprises a surface area that is larger than a surface area defined by an open area defined by said at least one aperture.

13. The electronic device according to claim 8, further comprising at least one additional antenna pocket positioned on the internal wall of the at least one aperture.

14. The electronic device according to claim 8, wherein said solid antenna bracket is positioned within the interior space of the housing near the top thereof and includes flexible tabs for side impact protection.

15. An electronic device comprising:

a housing having a bottom, side walls and a top defining an interior space, the housing having a polygon shape;

a solid antenna bracket, located in the interior space, having a top surface, walls and at least one aperture passing through the top surface, said walls of said solid antenna bracket being rounded to a radius;

a plurality of antenna pockets disposed on at least one of the walls of the antenna bracket, each of the plurality of antenna pockets receiving and securing an antenna, said wall radius preventing impedance changes in antenna wires connected to the plurality of antenna pockets through the at least one aperture; and flexible tabs mounted to the solid antenna bracket to provide side impact protection.

* * * * *